(12) United States Patent
Nawrocki

(10) Patent No.: US 9,467,110 B1
(45) Date of Patent: Oct. 11, 2016

(54) ELECTRONIC SYSTEM OF A HYBRID AMPLIFIER

(71) Applicant: Piotr Nawrocki, Inowroclaw (PL)

(72) Inventor: Piotr Nawrocki, Inowroclaw (PL)

( * ) Notice: Subject to any disclaimer, the term of this patent is extended or adjusted under 35 U.S.C. 154(b) by 0 days.

(21) Appl. No.: 14/864,711

(22) Filed: Sep. 24, 2015

(51) Int. Cl.
  *H03F 1/00* (2006.01)
  *H03F 5/00* (2006.01)
  *H03F 1/02* (2006.01)

(52) U.S. Cl.
  CPC *H03F 5/00* (2013.01); *H03F 1/02* (2013.01); *H03F 2200/03* (2013.01)

(58) Field of Classification Search
  CPC .............. H03F 1/00; H03F 3/58; H03F 3/54
  USPC ...................... 330/3, 4.6, 5, 41–44
  See application file for complete search history.

(56) References Cited

U.S. PATENT DOCUMENTS

| | | | |
|---|---|---|---|
| 2,706,286 A * | 4/1955 | Wheeler .............. | H04B 17/406 455/8 |
| 6,737,915 B1 * | 5/2004 | Harner ...................... | H03F 5/00 330/299 |
| 2008/0018397 A1 * | 1/2008 | Frankland et al. ....... | H03F 1/26 330/71 |

* cited by examiner

*Primary Examiner* — Henry Choe
(74) *Attorney, Agent, or Firm* — Masuvalley & Partners

(57) ABSTRACT

An electronic system of a hybrid amplifier is described, especially electroacoustic hybrid amplifier comprising a tube voltage amplifier, a tube isolating repeater, a power repeater, and a power repeater power supply, a voltage amplifier power supply, and an isolating repeater power supply.

9 Claims, 7 Drawing Sheets

ELECTRONIC SYSTEM OF A HYBRID AMPLIFIER

BACKGROUND

The invention relates to a hybrid electronic amplifier, especially an electroacoustic hybrid amplifier.

The electroacoustic amplifier, an audio amplifier—is an amplifier operating in the range of acoustic frequencies (16 Hz-20 kHz). An electroacoustic amplifier is used to amplify analogue signals from electroacoustic sources, such as a phonograph, a tape recorder, a microphone, a radio, an electrophone, a CD player, or an MP3 player. The amplifier can be built using transistors, vacuum tubes or both of these active electronic components. Electroacoustic amplifier output is typically loaded by a speaker system, often called a loudspeaker, which is programmed to process the amplified electroacoustic signal energy into acoustic waves.

The main parameters of the electroacoustic amplifier are:
Bandwidth (useful frequency range processed by the amplifier);
Frequency characteristics (graph of change in amplifications with respect to the useful acoustic band);
The signal-to-noise ratio (S/N ratio, Decibels dB);
Total harmonic distortion (THD+N, with respect to the reference signal and the nominal power);
Intermodulation distortion factor (%);
The signal dynamics (dB);
Damping factor (the ratio of load impedance to source impedance);
Maximum rated power (RMS efficient power, Watts, W);
Load output (permissible range of loudspeaker impedance, frequency dependent);
Energy efficiency (depending on the applied power amplifier).

These parameters can be used for overall quality of the amplifier, but do not set the level of fidelity of the output signal relative to the input with reference to the psychoacoustic reception.

The constructions of high fidelity electroacoustic amplifiers with (ang. Hi-Fi) seek to establish a broad-band sound transmitted by the amplifier with low distortion and flat response amplification for frequency response.

A hybrid is a combination of solutions seemingly incompatible with each other in one machine (concurrent system). Most often it is a combination of several devices previously produced separately in one (i.e. halogen ovens, harvesters).

Multifunctional devices, e.g. a scanner, a printer, a fax, a card reader and a copier.

The present invention relates to a low-frequency power amplifier (MW) intended, for example, to work with audio devices, mainly line-level output signal. This is an electronic amplifier for amplifying complex sonic signals to a level that is able to control the operation of the loudspeakers.

The amplifier design is a mixed configuration connecting tube technology with transistor. The amplifier of this type of configuration is commonly called a hybrid. Currently more common amplifiers are exclusively based on transistors called transistor amplifiers. Transistor amplifiers are commonly used in applications such as RF (Radio Frequency), OFC (Optical Fiber Cable, fiber optic telecommunications), etc. Transistor audio amplifiers are used most often in everyday life. Nowadays there are many supporters and opponents of transistor sound. The presented hybrid is an alternative for those who love the tube sound, and people who like the sound and qualities of transistor power amplifiers.

As is widely known, every element of the acoustic track and amplifier design and arrangement of power systems has an impact on the nature of the sound of the amplifier adjusting the loudspeakers. It is safe to say that each amplifier plays differently. Of course, the type and quality of the components used to build audio tracks, power amplifiers also have a significant impact on the nature and quality of sound, in this case a minimal impact of audio systems on the change the character of the reproduced sonic signal "driving" the loudspeakers was obtained; mainly due to the amplifier topology.

CN203206450U publication describes a model of a stereo audio amplifier transistor Push-Pull, in which the signal amplifier circuit includes an additional reference amplifier circuit. By using high impedance at amplifier input, adverse effect of the amplifier working with the sound source with high impedance is minimised. Additionally, by removing a large negative feedback loop, sound quality is improved. Despite improvements in the design of the amplifier, it remains an amplifier based on transistors, which does not provide the sound quality of tube amplifiers.

Similarly U.S. Pat. No. 3,808,545A document describes the construction of an audio amplifier that provides low distortion of audio signal even when working with power levels exceeding 600 W, which, however, remains an amplifier based on transistor technology.

U.S. Pat. No. 8,525,710B1 document describes a method for removing transfers between a digital signal reaching the amplifier and an analogue signal at the output of the amplifier through monitoring significant values for the comparison and correction of the signal. The solution focuses on the method of converting analogue and digital signals and their analysis, without elaborating amplifier technology as such.

In the light of the cited documents it is clear that there are no solutions in the field of audio amplifiers that provide very high sound quality while combining the benefits and abilities of both tube and transistor amplifiers.

According to the invention, the electronic system of a hybrid amplifier, especially electroacoustic hybrid amplifier comprises a tube voltage amplifier, a tube isolating repeater, a power repeater, and a power repeater power supply, a voltage amplifier power supply, an isolating repeater power supply, where
said tube voltage amplifier includes:
vacuum tube (N1), preferably Russian tube symbol 6N2P connected by a grid to a resistor (R1) and then to a resistor (Rz), preferably with a value of 1 MΩ, by a cathode to a resistor (Rz'), preferably with a value of 1 kΩ by an anode to one end of a resistor (R1'), preferably with a value of 1 kΩ
vacuum tube (N1'), preferably a Russian tube symbol 6N2P, connected by a cathode to the second end of the resistor (R1'),
tube isolating repeater includes:
vacuum tube (N2), preferably a Russian tube symbol 6N6P, connected by a cathode to one end of the resistor (R2), which second end is connected to the ground; by a grid to the other end of the resistor (R2) and the ground;
vacuum tube (N2'), preferably a Russian tube symbol 6N6P, connected by a cathode to the anode of the electron tube (N2);
said power repeater comprises two branches, each of which includes:
a transistor (T, T') of the MOSFET type;
a capacitor (C1, C1') with one end connected to the gate of said transistor (T, T');

a diode (D, D'), preferably a Zener diode, connected at one end to a source of said transistor (T, T') and the second end of the resistor (R3, R3') and the capacitor (C1, C1'), wherein the LED (D) of the first branch connected by the cathode to the source of the transistor (T) and the anode with a resistor (R3) and capacitor (C1) and the diode (D') of the second branch connects via the cathode to the source of the transistor (T') and via the anode with the resistor (R3') and the capacitor (C1');

a resistor (R4, R4') connected to the drain of the said transistor (T, T') and the said resistor (R2, R2')

wherein said branches are connected to each other by means of:

a resistor (R5) which at one end is connected to the resistors (R3) and (R4) of the first branch and the second end to the resistors (R3') and (R3') of the second branch, and the load of a power repeater, preferably loudspeakers (S), one end of which is connected to the cathode of the diode (D) and the source of the transistor (T) of the first branch and the anode of the diode (D') and the source of the transistor (T') of the second branch, and the capacitor (C1) of the first branch and the capacitor (C1') of the second branch are interconnected by ends remote from gate transistor (T), (T');

said power repeater power supply comprises:

two filters type PI, each of which comprises a transistor (R6, R6'), preferably with a value of 1Ω, coupled on the first side to a capacitor (C2, C2'), on the other— with a capacitor (C3, C3');

wherein the capacitor (C2) is connected to the capacitor (C2'), and the capacitor (C3) is connected to the capacitor (C3');

a battery of electrolytic capacitors (U) connected on the first side to the capacitor (C3) and the resistor (R6) of the first filter, on the other side with the capacitor (C3') and the resistor (R6') of the second filter, each of said voltage amplifier power supply and said separating repeater power supply includes:

a filter type PI, which comprises a transistor (R7, R7'), preferably with a value of 1Ω, coupled on the first side to a capacitor (C4, C4'), on the other—with a capacitor (C5, C5');

a battery of electrolytic capacitors (U1, U1') coupled on the first side to the capacitor (C5, C5') and a resistor (R7, R7') and, on the other side to a capacitor (C4, C4') and a capacitor (C5, C5') and the ground (M, M');

wherein the capacitors (C4, C4') and (C5, C5') are connected with the end remote from the resistor (R7, R7') to the ground (M, M').

wherein said tube voltage amplifier is adapted to attach it:

to the audio signal source by resistor (R1) with the end remote from the electron tube grid (N1)

to said voltage amplifier power supply by means of electron tube (N1') connected to the anode of the capacitor (C4) and the resistor (R7);

said tube isolating repeater is adapted to connect it:

to said tube voltage amplifier through the tubes (N1), (N1') and (N2'), where the electron tube (N1) anode is connected to the electron tube (N1') grid and the resistor (R1) and the electron tube (N2') grid to said isolating repeater power supply using the tube (N2') connected by the anode to the capacitor (C4') and the resistor (R7');

to the said power repeater by a capacitor (C1) with the end remote from the transistor (T) of the first branch and the capacitor (C1') with the end remote from the transistor (T') of the second branch connected to the anode of the tube (N2) and the tube (N2') cathode.

said power repeater is adapted to connect it:

with said power repeater power supply by:

a capacitor (C2, C2') and a resistor (R6, R6') connected to a resistor (R4, R4'), and a drain of the transistor (T, T'), power repeater (S) load, which is connected by the end remote from the transistor (T), (T') and the diodes (D), (D') to the capacitor (C2) of the first branch and the capacitor (C2') of the second branch, and then with the capacitors (C3) of the first branch and the capacitor (C3') of the second branch, and further to the ground.

Preferably, the first branch of said amplifier is adapted to be supplied with negative voltage, and the second branch-positive voltage.

Preferably, the branch amplifier adapted to be supplied with a positive voltage for the field effect transistor with an insulated IGFET gate MOSFET type with N-type enriched channel.

Preferably, the branch amplifier adapted to be supplied with a negative voltage there is a field effect transistor with an insulated IGFET gate MOSFET type with P-type enriched channel.

Preferably, the transistor (T, T') is selected from the family BUZ, IRF IRFP, 2SC and 2SJ etc.

Preferably, the system is configured to operate without global feedback in open loop feedback.

Preferably, the system contains additional signal processors, preferably noise gates, filters, dynamics compressors, parametric equalisers or limiters.

Preferably, the system is part of a larger system, in particular track microphone, alone or in a mixer or console.

Preferably, the system is configured to transmit audio signals, preferably analogue, mono, stereo or sonic multi-signal ones.

BRIEF DESCRIPTION OF THE DRAWINGS

The invention will now be further described in the preferred embodiment, with reference to the accompanying drawings, in which.

DESCRIPTION OF EMBODIMENTS

Figure 1:
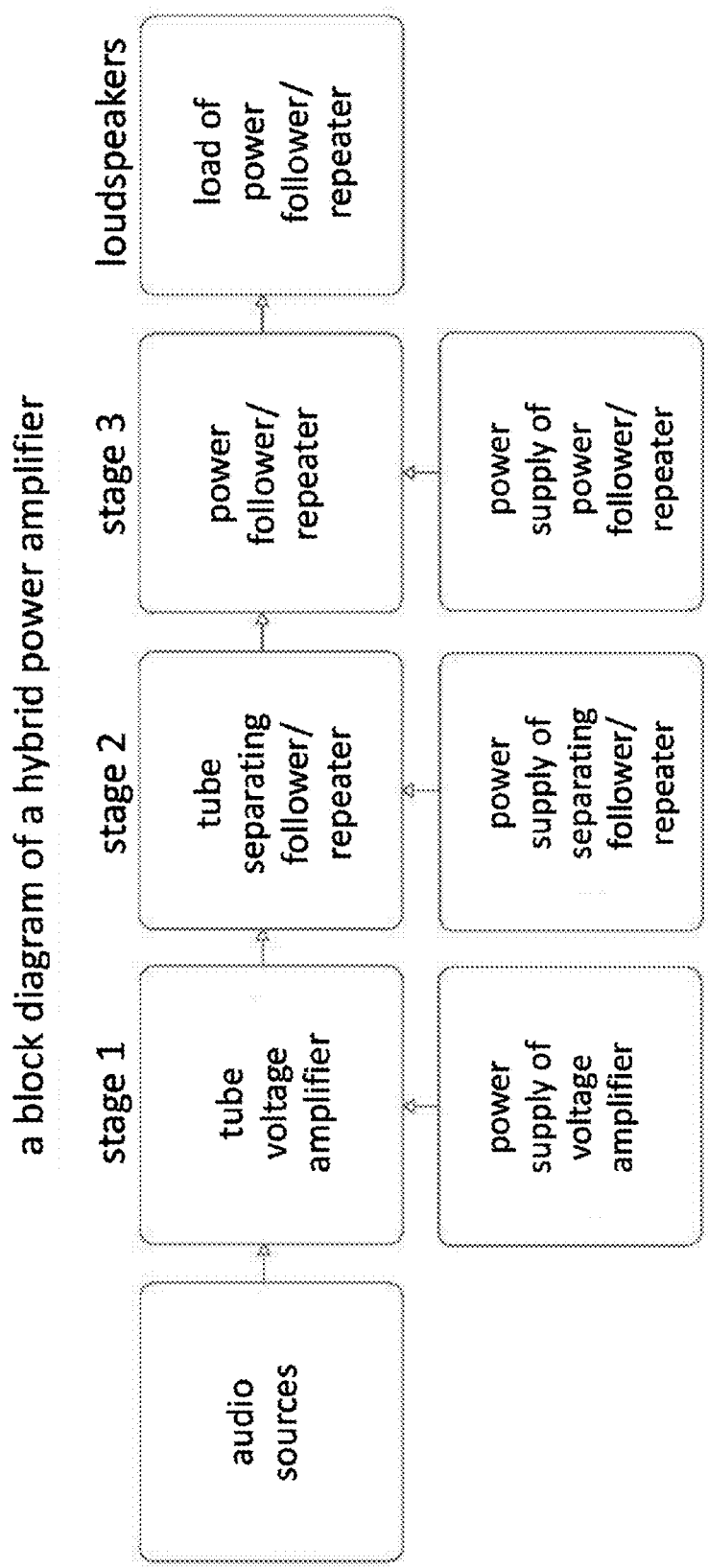
FIG. 1 is a block diagram of a hybrid push-pull amplifier.

Specific embodiments of the invention will now be described with reference to the accompanying drawings.

This invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the embodiments illustrated in the accompanying drawings is not intended to be limiting of the invention. In the drawings, like numbers refer to like elements.

The figures use the following indications: N1, N1', N2, N2'-vacuum tube; U, U1 and U1'-electrolytic capacitors battery; M, M'-grounding; T-a field effect transistor (FET) with insulated gate IGFET type MOSFET with a channel enriched with n-type branch of the amplifier supplied with a negative voltage,-T'-a field effect transistor with insulated gate IGFET type MOSFET enriched with n-type branch of the amplifier supplied with a positive voltage; D-Zener diode in the branch of the amplifier supplied with negative voltage; D'-Zener diode in the branch of the amplifier supplied with positive voltage; C1-C3-capacitors in the branch of the amplifier supplied with negative voltage; C1'-C3'-capacitors in the branch of the amplifier supplied with positive voltage; C4, C4', C5, C5'-intensifier tube voltage capacitors; R1, R1', R2, R7, R7'-resistors in the voltage amplifier tube, tube separating repeater and their respective power supplies; R3-R6-resistors in the branch of the amplifier supplied with negative voltage; R3'-R6'-resistors in the branch of the amplifier supplied with positive voltage; Rz-resistor located in the source audio signal with a value of 1 MΩ; Rz'-a resistor located in the tube voltage amplifier; S-ohmic load power, e.g. loudspeakers.

The presented construction is a sonic signal amplifier working completely in class A without the average power feedback loop. The block diagram of the amplifier is shown in FIG. 1. The amplifier comprises three stages LW, also working in class A. The first two stages of the amplifier is a tube circuitry built based on electronic components (electron tubes). The third stage is a transistor circuit. As mentioned previously, the presented amplifier was made in analogue technology combining the technique of vacuum tubes and transistors. Colloquially, this combination of audio technology is called a hybrid amplifier. For the construction of the amplifier, two types of Russian tubes were used. In the first stage of the amplifier a Russian tube symbol 6N2P operates. This is a LF tube. It acts as a voltage amplifier with high gain. In the second stage of the tube-part of the amplifier a Russian tube symbol 6N2P operates as well. It is a HF tube, which behaves and performs very well in audio applications. In the amplifier circuit it functions as a cathode repeater of high current efficiency. The tube part of both the first and second driver stage is powered by a stabilised voltage of 300V. An LF signal coming from a suitable audio signal source is fed via a potentiometer slider to adjust the volume on the first tube stage voltage amplifier with high input impedance and a similar output. The second stage of the voltage preamplifier is an LF tube cathode current repeater; this in turn is of very high input impedance; at the same time of very high current efficiency and low output impedance that is not physically demanding to sensitive to the heavy burden working with a small quiescent current for the DC voltage of the vacuum tube amplifier of the first degree. The audio signal of the second stage is fed to the third stage, which is the transistor power repeater; directly to the input via the separating-engaging capacitor. An LF tube amplifier together with an LF tube repeater form an integrated ultra-linear preamplifier of the direct-coupled tube driver.

It is therefore a DC amplifier working in class A, processing, amplifying the LF variable component. Its proper operation for both the fixed component and the variable component is possible if the capacity of the repeater cathode in relation to weight will be higher than the capacity of the second triode anode of the voltage amplifier. In view of the fact that the first two stages of the amplifier are galvanically coupled with each other by the appropriate suspension of the secondary tube grid (required capacity difference)—of the said repeater. The repeater is equipped with an active current source, whose tasks include stabilisation and control of the dispersion of solid voltages and currents in the system of the driver, so the operating point of tubes for the fixed component.

If, for some reason, the predetermined values of the supply voltage of the first or second degree tube slightly change the system automatically adjusts the critical voltages and currents present in the system, which set the desired operating points of the active elements. Thus, stability of the electrical parameters of this stage will always be retained. In this configuration the tube system will always operate in the declared class A.

Integrating the tube part with the transistor one is performed by high quality coupling capacitors. At the same time they block the fixed component to protect transistors from destruction. The value of the fixed component on the tube repeater side is almost equal to half the supply voltage of the tube system. In contrast, on the side of the transistor voltage constant component it is equal to the voltage of opening gates of the power transistors. By contrast, on the transistor side the voltage of the fixed component is equal to the voltage of opening of the power transistor gates. Coupling capacitors, also lead amplified audio signal from the tube part to the third stage of the amplifier through them.

Current power amplifier works in class A and is characterised by a very high power efficiency. It works with a very large quiescent current power transistors in push-pull configuration. A power repeater is built in a transistor technology MOS-FET based on IRFP240 and IRFP 9240 pair. For this purpose and in this configuration almost any complementary power transistors MOS-FET are also well suited for systems used in the LF end power amplifiers. Quite common are power transistors of the family BUZ, IRF, IRFP, 2SC and 2SJ and many similar.

In the present configuration of the power repeater one can easily discern an analogy to tube audio voltage supply systems, that is, solutions proven for many years. The first two stages of the power amplifier are vacuum tube systems, so to implement a high current capacity power repeater in the presented amplifier corresponding to tube power systems is justified and worthwhile. And so it happened. However, the system has been simplified to a minimum. From a global point of view for power amplifiers solutions the presented solution is primarily devoid of a transformer speaker—a characteristic of Push-Pull tube systems and SE, and has no current sources, an output capacitor separating the power supply from the load, which are common elements in commercial applications based on purely transistor systems working in class A with a single power transistor. In the present final power system only two passive separating components for the system power transistor gate polarisation from the power supply circuit were added.

The minimalist form of the power system was one of the design intents.

The power amplifier system in addition to transforming the control voltage obtained from the driver into the current driven to the load, at the same time fitting for active and passive load (nature of the work for a variable component) plays a role of balun of power transistors supply voltage. One can say that it creates the power for itself. Namely, for the proper operation of the power system symmetrical voltage is necessary.

By contrast, the main source of power system supply is unregulated unbalanced voltage of 60V. The power system, by virtue of its construction, produces symmetrical voltage by itself, it means that it divides the unbalanced voltage of 60V in half; and thus creates a symmetrical voltage (plus) +30V, 0=ground (minus) −30V. So the PSU is purposely a very simple solution, designed on purpose, based on a battery of electrolytic capacitors of high filtering capacity. After the automatic voltage balancing the power supply filter was separated as a balanced PI filter, supplying "its" power transistor. Cumulative capacity of filter capacitors was split by resistor 1Ω, on which the measurement of the power transistors quiescent current is done.

So from one supply voltage we gain two symmetrical voltages necessary for the proper operation of a pair of complementary power. In addition, the power system generates the analogue mass of the entire amplifier which separated itself in the process of symmetrisation of power voltages. This is an incredible asset of the amplifier affecting, for example, the outstanding sonic qualities of the entire amplifier.

In this configuration, and consequently in the power system so designed there is no problem of the offset voltage of the amplifier at its output. Thanks to its electrical properties the power system of audio always strives for balance. It consists in the fact that the offset voltage of the amplifier on the circuit load is always zero, while the supply voltage is always symmetrical. Even in the severe power fluctuations or changes occurring in the load. Thanks to this, the power system is devoid of offset voltage regulatory elements. The only control element in the repeater system is the element setting the voltage for opening transistor gates, which involves a determination of quiescent currents of the power transistors for the fixed component.

If for any reason voltage power supply setpoints for the system change or there are changes in the nature of the load of the presented repeater, for example the electricity supply ~110V/230V rises or falls; applied to the primary winding of the transformer which automatically will change the unbalanced voltage on the secondary side of the transformer; the system automatically corrects and re-divides asymmetrically balanced power supply voltage, establishes critical power supply voltage and determines quiescent currents of the repeater power transistors and will not allow a fixed component occur on the load, i.e. the output of the amplifier. In this configuration, the power system will always work correctly with more or less transistors quiescent current power in the declared class A, and thus, stability of the electrical parameters of this stage will always be retained. Example Elements of the Subject of the Application:

The type of construction of the presented power amplifier and active elements of the audio track closely associated with the advantages of vacuum elements application and MOS-FET transistors has a positive impact on the process of creating sound and electroacoustic parameters of the amplifier.

The construction of a hybrid low-frequency amplifier has been developed with respect to the following criteria:

1. The intended use is the transfer of the most faithful quantities of reliable, real, unspoilt audio information and sonic qualities received from the sound source with no degradation of information. Full use of the advantages of electro-acoustic sound source and model sound reproduction, especially having in mind no disturbance and no degradation of received information directly from the sound source or D/A converter, etc. Furthermore, very good cooperation with the load in the form of loudspeakers.

Figure 2:
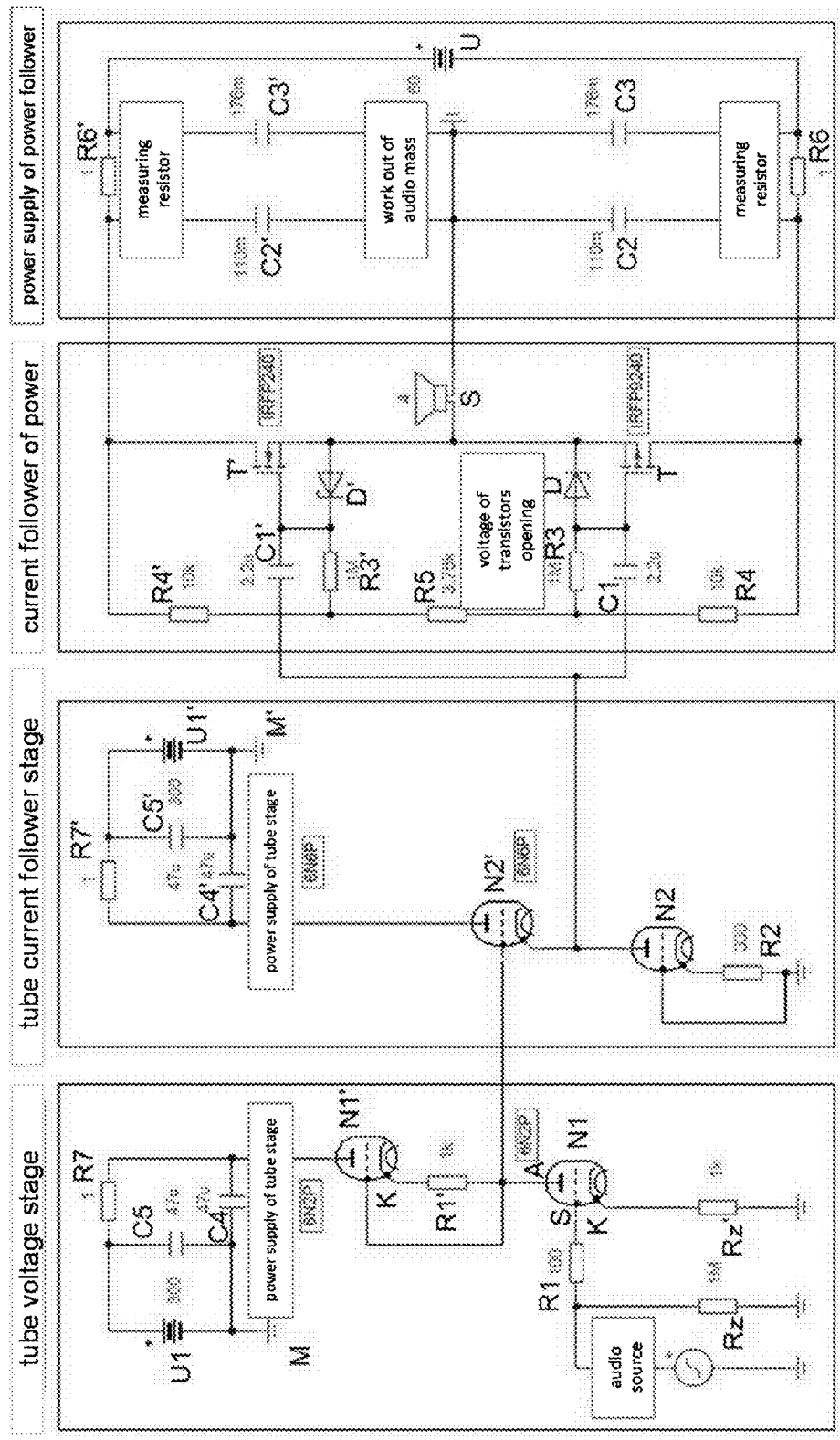
FIG. 2 shows a diagram of application of a hybrid push-pull amplifier with distinction of each grade.

2. Power amplifier hybrid system works in class A with very large quiescent current due to the required low level of distortion. The system was built using a small number of elements in push-pull configuration based on discrete components, which are vacuum tubes and transistors MOS-FET. It is a complementary power amplifier with high current capacity. Due to the optimal configuration, the system is characterised by very low non-linear distortion across the audio band. Although the system moves the phase of the output signal relative to the input signal (control), it is not subject to the global feedback loop. The topology of a hybrid push-pull amplifier with isolation of the individual steps is shown in FIG. 2.

Figure 3:
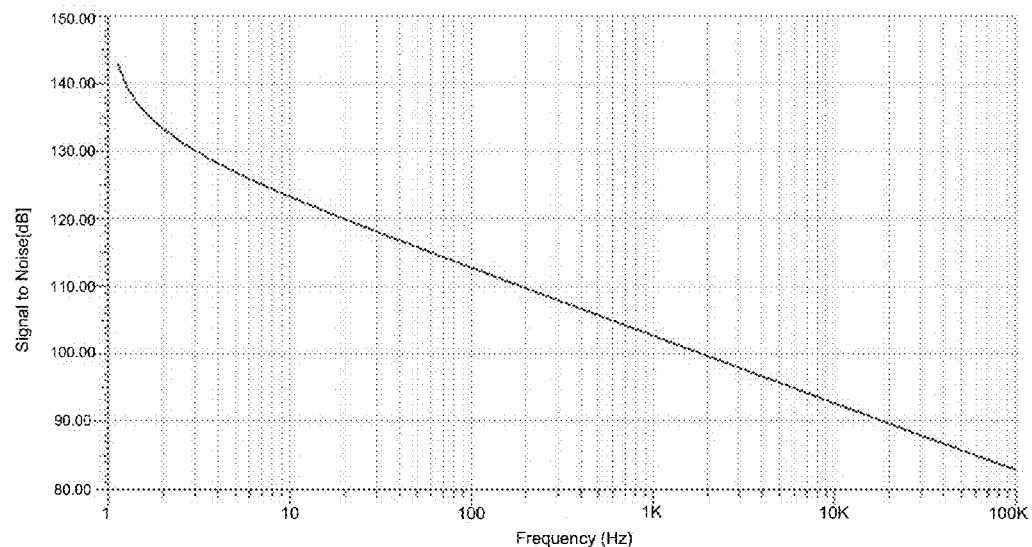
FIG. 3 shows a measurement of the useful signal relative to noise /SN/ of the hybrid power amplifier.
Figure 4:
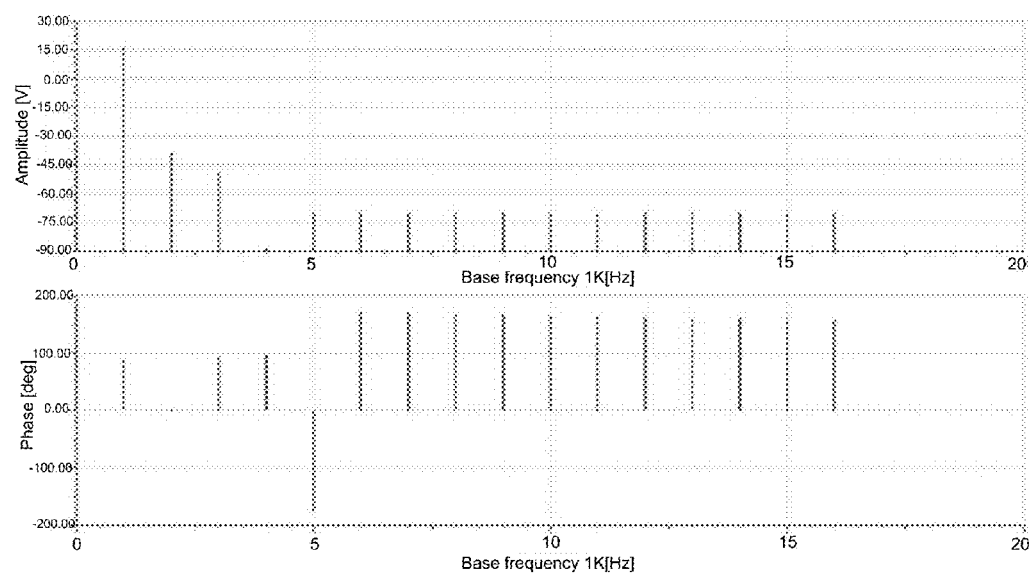
FIG. 4 shows the distribution of harmonic of the frequency 1 KHz of the hybrid power amplifier.

3. The configuration of the presented audio amplifier and the amplifier power supply has a very positive influence on the signal-to-noise ratio S/N of the system. The amplifier has a very good harmonic distribution at the large linear signal adjusting the power repeater. FIG. 3 shows a measurement of the useful signal relative to noise /SN/ of the hybrid. Distribution of harmonic frequency of 1 kHz is shown in FIG. 4.

Figure 5:
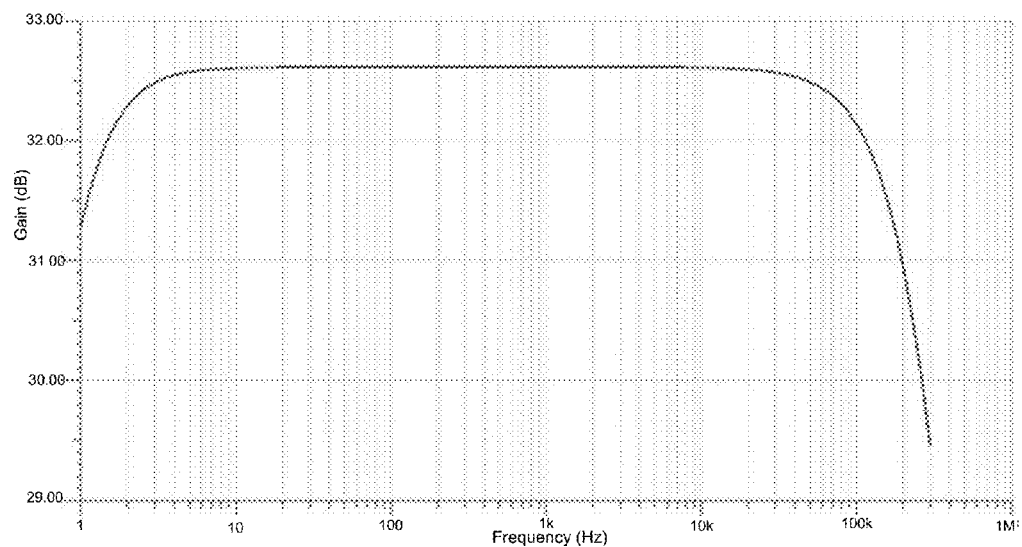
FIG. 5 shows a measurement of the transmitted frequency band of the hybrid power amplifier.
Figure 6:
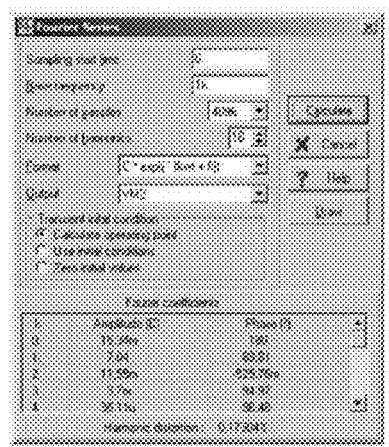
FIG. 6 shows a measure of non-linear distortion for 1 kHz of the hybrid power amplifier.

4. The system operates without global feedback open-loop with very large bandwidth frequency response, therefore yielding a very high speed of the power amplifier which compiles well with each linear sound source. Measuring the frequency response of the band is shown in FIG. 5. And also relatively small harmonic distortion was obtained. The measurement of nonlinear distortion of the amplifier system for 1 kHz is shown in FIG. 6.

Figure 7:
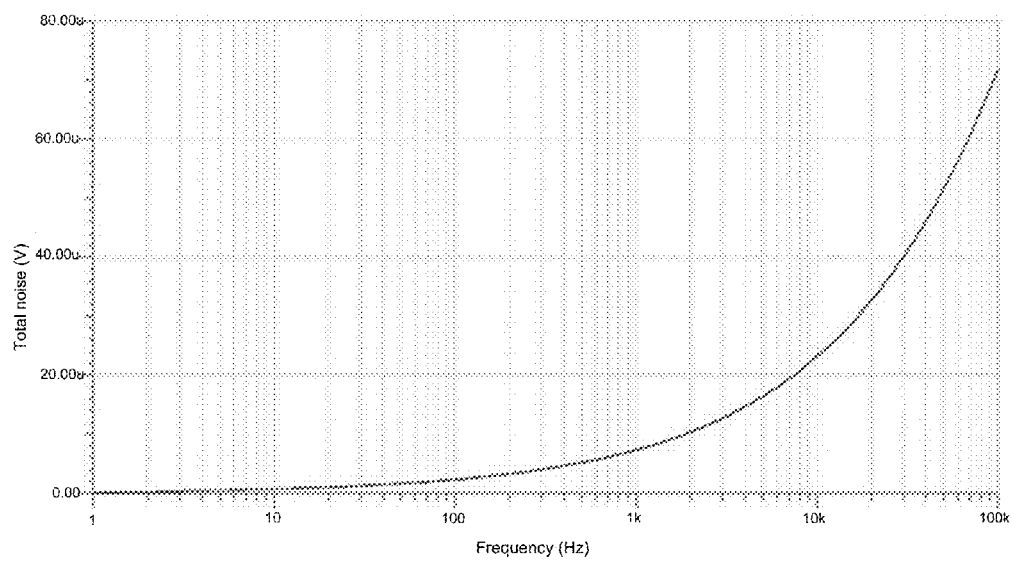
FIG. 7 shows the measurement of the total noise of the hybrid power amplifier.

5. Giving control signal of 330 mV/1 kHz/233 mV RMS/ to the amplifier we gain approx. 10 V RMS/1 kHz at 4Ω load, which is adequate; approx. 25 W power with distortion of 0.17% in the open-loop and total noise up to approx. 70 uV to 100 kHz. The measurements refer to a pair of IRFP 240/9240 with quiescent current of +/−1.5 A and a supply voltage of +/−30V. The total noise of the repeater is shown in FIG. 7.

6. For the proper operation of the low-frequency push-pull transistor current repeater system symmetrical voltage is required. Such requirements are met by supply system with very good filtration and simple structure implemented to supply the low-frequency current repeater system MOS-FET. The power supply system is integrated with the current repeater system, which is shown in FIG. 2.

7. The main source of power of the current audio system is unbalanced unregulated DC voltage. The presented current repeater system, by virtue of its construction, produces a symmetrical voltage by itself. From one supply voltage we gain two symmetrical voltages necessary for the proper operation of a push-pull complementary pair. So the PSU is purposely a very simple solution based on a battery of electrolytic capacitors of high capacity. After the automatic voltage balancing the power supply filter was separated as a balanced PI filter. An equal number of filter capacitors was divided by a 1Ω resistor where the measurement of the quiescent current for the repeater system branch supplied with positive and negative voltage is done. In addition, the LF current repeater system generates the system analog mass which separated itself in the process of balancing the voltages. At the point of contact of MOS-FET transistors sources and connecting the load there will always be the offset voltage equal to 0. Therefore there is no need to use expensive high quality capacitor separating the next steps of the audio system, for example, LF amplifier. Besides, we consciously eliminate redundant element of the electroacoustic track.

In this way, the low-frequency push-pull transistor current repeater generates the audio grounding by itself. Accordingly, the present arrangement balances itself. In this configuration the system will always operate in the declared class A with the specified criteria.

Figure 8:
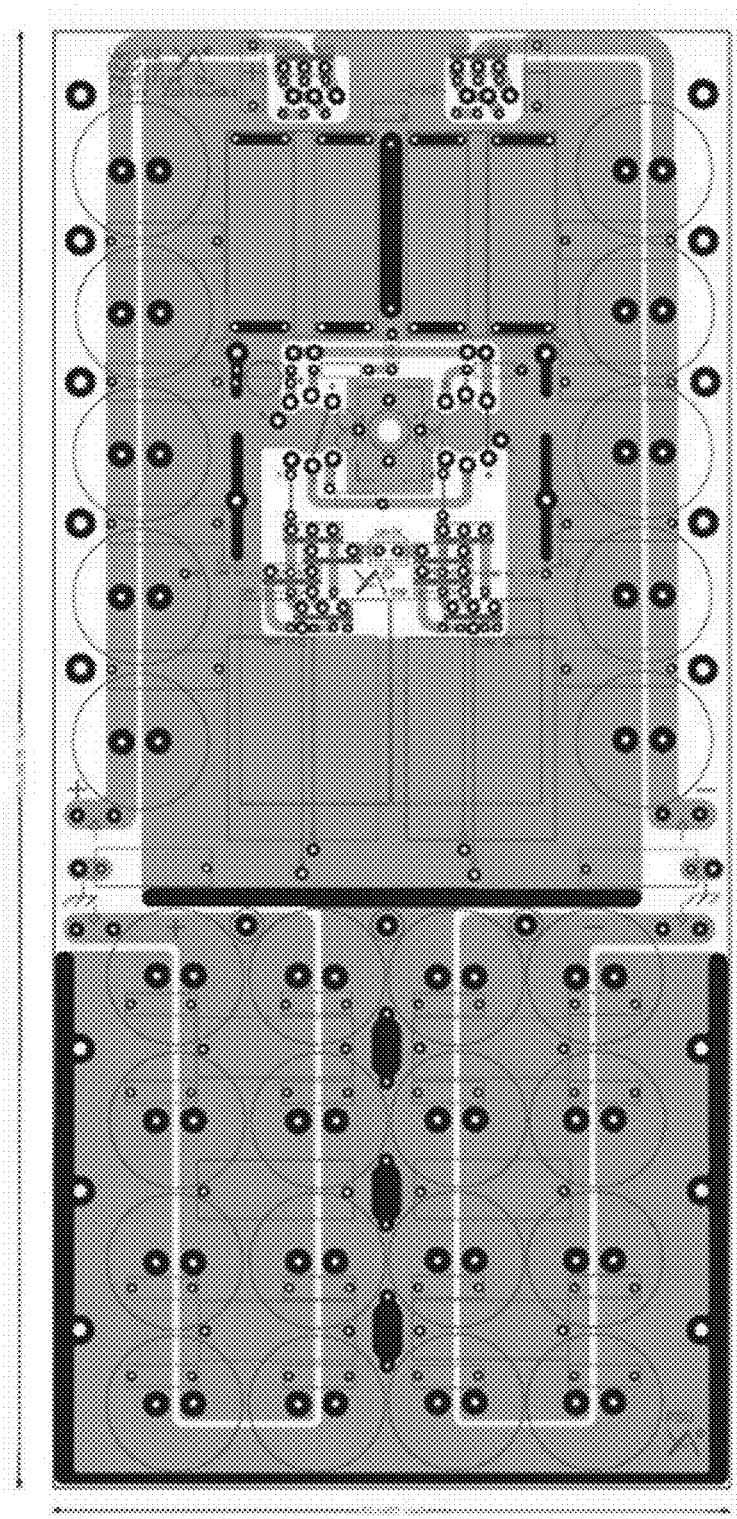
FIG. 8 shows a mosaic of the motherboard PCB tracks (Printed Circuit Board) of the hybrid power amplifier.
Figure 9:
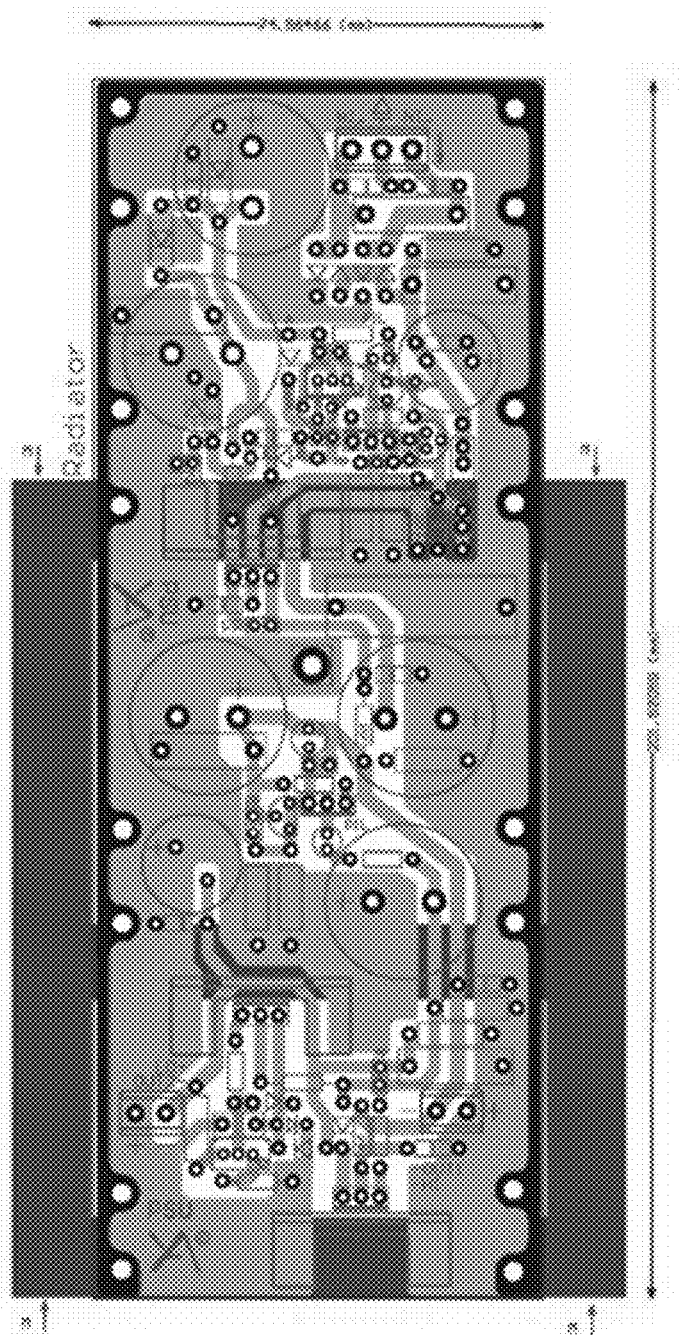
FIG. 9 shows a mosaic of PCB motherboard mosaic of the voltage power supply of the level of the tube hybrid power amplifier.

8. The system was built using a minimum number of parts, based on discrete tubes and MOS-FET transistors used in the push-pull configuration art of the audio. To properly determine the operating points of the transistors, that is, their correct operation, passive components, i.e. resistors and capacitors, were used. Capacitors serve as separating means. At the same time they block and prevent the passage of the DC component present in the pre-amp and power amplifier to other levels of audio system with which it can work. The hybrid has been placed on a single motherboard, which includes a power amplifier power supply filter capacitors, tube part, power supply filter elements of the tube part 300V. In contrast, tube part 300V power supplies were built on separate circuit boards. In addition, for proper operation of the whole system you need a power transformer, which lowers the grid voltage ~110V/230V to the desired value, rectifier bridges, 1 Ohm measuring resistors, electrolytic capacitors of the power supply filter constituting the power system and other equipment used in the anode power supply system. The circuit board of the hybrid is shown in FIG. 8. The anode power supply plate is shown in FIG. 9.

Characteristics:

The minimalist design that was used to build ultra-linear preamplifier and power amplifier without the feedback loop and a special way of power supply, as well as the active elements of the audio track, have a positive impact on the process of creating sound, but due to the topology of the system this impact was brought to a minimum. Therefore, this amplifier design provides for a number of criteria of top-class devices of this type.

Examples of the Use of the Subject of the Application

The presented amplifier can be used in professional and commercial audio and video equipment.

The presented transmission medium is especially recommended to: electroacousticians, sound engineers and producers, musicians, music lovers, audiophiles, etc. The hybrid is primarily intended as a standalone power amplifier. It can also be part of a larger whole, the microphone track amplifier, a part of a mixer, console, including additional signal processors, such as, for example a noise gate, filters, dynamics compressors, parametric equalisers, limiters, and other types of equipment used in the audio art. It may also have a role as a medium for connections: analogue audio signals, mono, stereo, also multi-signal sonic ones, etc.

Advantages of the Invention

Simple hybrid topology of low-frequency power amplifier.

The power amplifier system is a minimalist design working in class A with large quiescent current in a push-pull configuration, with automatic balancing of voltage imbalance.

Because of the design solution the system is stable without negative feedback, in the open-loop with a wide bandwidth frequency response.

The power amplifier system automatically generates a circuit analogue mass, which is also the main ground which separated itself in the process of balancing the supply voltage on switching the power—even though the main power source of the present system voltage is unbalanced.

The power amplifier system was built on the main PCB comprising the power amplifier power supply filter capacitors, the vacuum tube part, the filter and the power supply elements of the vacuum tube part and the tube driver.

Although the invention has been described in terms of particular embodiments and applications, one of ordinary skill in the art, in light of this teaching, can generate additional embodiments and modifications without departing from the spirit of or exceeding the scope of the claimed invention. Accordingly, it is to be understood that the drawings and descriptions herein are proffered by way of example to facilitate comprehension of the invention and should not be construed to limit the scope thereof.

The invention claimed is:

1. An electronic system of a hybrid amplifier, especially electroacoustic hybrid amplifier comprising a tube voltage amplifier, a tube isolating repeater, a power repeater, and a power repeater power supply, a voltage amplifier power supply, an isolating repeater power supply, where
    said tube voltage amplifier includes:
        a vacuum tube (N1), preferably Russian tube symbol 6N2P connected by a grid to a resistor (R1) and then to a resistor (Rz), preferably with a value of 1 MΩ, by a cathode to a resistor (Rz'), preferably with a value of 1 kΩ by an anode to one end of a resistor (R1'), preferably with a value of 1 kΩ
        a vacuum tube (N1'), preferably a Russian tube symbol 6N2P, connected by a cathode to the second end of the resistor (R1'),
    said tube isolating repeater includes:
        a vacuum tube (N2), preferably a Russian tube symbol 6N6P, connected by a cathode to one end of the resistor (R2), in which the second end is connected to the ground; by a grid to the other end of the resistor (R2) and the ground;
        vacuum tube (N2'), preferably a Russian tube symbol 6N6P, connected by a cathode to the anode of the electron tube (N2);
    said power repeater comprises two branches, each of which includes:
        a transistor (T, T') of the MOSFET type;
        a capacitor (C1, C1') with one end connected to the gate of said transistor (T, T');
        a diode (D, D'), preferably a Zener diode, connected at one end to a source of said transistor (T, T') and the second end of the resistor (R3, R3') and the capacitor (C1, C1'), wherein the LED (D) of the first branch connected by the cathode to the source of the transistor (T) and the anode with a resistor (R3) and capacitor (C1) and the diode (D') of the second branch connects via the cathode to the source of the transistor (T') and via the anode with the resistor (R3') and the capacitor (C1');
        a resistor (R4, R4') connected to the drain of the said transistor (T, T') and the said resistor (R2, R2')
    wherein said branches are connected to each other by means of:
        a resistor (R5) which at one end is connected to the resistors (R3) and (R4) of the first branch and the second end to the resistors (R3') and (R3') of the second branch, and
        the load of a power repeater, preferably loudspeakers (S), one end of which is connected to the cathode of the diode (D) and the source of the transistor (T) of the first branch and the anode of the diode (D') and the source of the transistor (T') of the second branch and the capacitor (C1) of the first branch and the capacitor (C1') of the second branch are interconnected by ends remote from gate transistor (T), (T');

said power repeater power supply comprises:
two filters type PI, each of which comprises a transistor (R6, R6'), preferably with a value of 1Ω, coupled on the first side to a capacitor (C2, C2'), on the other—with a capacitor (C3, C3');
wherein the capacitor (C2) is connected to the capacitor (C2'), and the capacitor (C3) is connected to the capacitor (C3');
a battery of electrolytic capacitors (U) connected on the first side to the capacitor (C3) and the resistor (R6) of the first filter, on the other side with the capacitor (C3') and the resistor (R6') of the second filter,
each of said voltage amplifier power supply and said separating repeater power supply includes:
a filter type PI, which comprises a transistor (R7, R7'), preferably with a value of 1Ω, coupled on the first side to a capacitor (C4, C4'), on the other—with a capacitor (C5, C5');
a battery of electrolytic capacitors (U1, U1') coupled on the first side to the capacitor (C5, C5') and a resistor (R7, R7') and, on the other side to a capacitor (C4, C4') and a capacitor (C5, C5') and the ground (M, M');
wherein the capacitors and are connected with the end remote from the resistor (R7, R7') to the ground (M, M')
wherein
said tube voltage amplifier is adapted to attach it:
to the audio signal source by resistor (R1) with the end remote from the electron tube grid (N1)
to said voltage amplifier power supply by means of electron tube (N1') connected to the anode of the capacitor (C4) and the resistor (R7);
said tube isolating repeater is adapted to connect it:
to said tube voltage amplifier through the tubes (N1), (N1') and (N2'), where the electron tube (N1) anode is connected to the electron tube (N1') grid and the resistor (R1) and the electron tube (N2') grid to said isolating repeater power supply using the tube (N2') connected by the anode to the capacitor (C4') and the resistor (R7');
to the said power repeater by a capacitor (C1) with the end remote from the transistor (T) of the first branch and the capacitor (C1') with the end remote from the transistor (T') of the second branch connected to the anode of the tube (N2) and the tube (N2') cathode
said power repeater is adapted to connect it:
with said power repeater power supply by:
a capacitor (C2, C2') and a resistor (R6, R6') connected to a resistor (R4, R4'), and a drain of the transistor (T, T'),
power repeater (S) load, which is connected by the end remote from the transistor (T), (T') and the diodes (D), (D') to the capacitor (C2) of the first branch and the capacitor (C2') of the second branch, and then with the capacitors (C3) of the first branch and the capacitor (C3') of the second branch, and further to the ground.

2. The chip of claim 1, wherein the first branch of said amplifier is adapted to supply with negative voltage, and the second branch-positive voltage.

3. The system of claim 2, wherein the branch amplifier is adapted to be supplied with a positive voltage there is a field effect transistor with an insulated IGFET gate MOSFET type with N-type enriched channel.

4. The system of claim 2, wherein the branch amplifier is adapted to be supplied with a negative voltage there is a field effect transistor with an insulated IGFET gate MOSFET type with P-type enriched channel.

5. The system of claim 1, wherein the transistor (T, T') is selected from the family BUZ, IRF IRFP, 2SC and 2SJ etc.

6. The system according to claim 1, wherein it is configured to operate without global feedback in open loop feedback.

7. The system according to claim 1, wherein it comprises additional signal processors, preferably noise gates, filters, dynamics compressors, parametric equalisers or limiters.

8. The system according to claim 1, wherein it is part of a larger system, in particular a microphone track, alone or in a mixer or a console.

9. The system according to claim 1, wherein it is configured to transmit audio signals, preferably analogue, mono, stereo or sonic multi-signal ones.

* * * * *